(12) United States Patent
Petri et al.

(10) Patent No.: US 10,282,896 B1
(45) Date of Patent: May 7, 2019

(54) MODEL BASED ANALYSIS OF A THREE-DIMENSIONAL ZONE IN AN AIRCRAFT

(71) Applicant: The Boeing Company, Chicago, IL (US)

(72) Inventors: Tyler Junichi Petri, Seattle, WA (US); Daniel J. Fogarty, Mukilteo, WA (US); David H. Jones, Bellevue, WA (US); Roger Keith Nicholson, Seattle, WA (US); Lars Fucke, Madrid (ES); Kimberly Motonaga, Bothell, WA (US); Kevin Nicholas King, Mill Creek, WA (US); Chad Richard Douglas, Shoreline, WA (US)

(73) Assignee: The Boeing Company, Chicago, IL (US)

( * ) Notice: Subject to any disclaimer, the term of this patent is extended or adjusted under 35 U.S.C. 154(b) by 30 days.

(21) Appl. No.: 14/730,038

(22) Filed: Jun. 3, 2015

Related U.S. Application Data

(63) Continuation of application No. 14/300,581, filed on Jun. 10, 2014, now abandoned.

(51) Int. Cl.
   *G06N 5/02* (2006.01)
   *G06T 17/10* (2006.01)
   *B64F 5/00* (2017.01)

(52) U.S. Cl.
   CPC .......... *G06T 17/10* (2013.01); *B64F 5/0045* (2013.01)

(58) Field of Classification Search
   CPC .... G06Q 10/06; G06Q 10/0639; G06Q 50/20; G09B 7/00
   See application file for complete search history.

(56) References Cited

U.S. PATENT DOCUMENTS

| | | | |
|---|---|---|---|
| 2008/0004843 A1* | 1/2008 | Pozuelo Cabrera | G06F 17/5095 703/1 |
| 2011/0180656 A1* | 7/2011 | Shue | G05D 1/0077 244/17.13 |
| 2011/0258021 A1 | 10/2011 | Mumaw et al. | |
| 2014/0317037 A1* | 10/2014 | Andrews | G06N 5/02 706/46 |

OTHER PUBLICATIONS

Jones et al., "System and Method for Assessing Cumulative Effects of a Failure," U.S. Appl. No. 13/941,785, filed Jul. 15, 2013, 49 pages.

(Continued)

*Primary Examiner* — Yu Chen
(74) *Attorney, Agent, or Firm* — Yee & Associates, P.C.

(57) ABSTRACT

A method for zone analysis. A zone is identified in a three-dimensional physical model of a vehicle. The three-dimensional physical model includes geometry information and location information for physical components. An effect of an undesired operation of a group of components in a zone within the three-dimensional physical model of the vehicle is identified based on the three-dimensional physical model of the vehicle and a logical model of the vehicle including a logical architecture linking logical components to each other. Logical components in the logical model are mapped to the physical components in the three-dimensional physical model of the vehicle.

20 Claims, 13 Drawing Sheets

(56) References Cited

OTHER PUBLICATIONS

Fritz, "System Dependency Analysis for Complex Aircraft Systems," SAE International, AeroTech Congress & Exhibition, Sep. 2007, 13 pages.

Fritz, "System Dependency Analysis as a Common Cause Search Engine for Complex Aircraft Systems," SAE International, Journal of Aerospace, vol. 2, Issue 1, Nov. 2009, pp. 21-27.

Fritz, "System Dependency Analysis Supporting Common Cause Analyses of Complex Aircraft Systems," SAE International, Journal of Aerospace, vol. 2, Issue 1, Nov. 2009, pp. 28-39.

* cited by examiner

MODEL BASED ANALYSIS OF A THREE-DIMENSIONAL ZONE IN AN AIRCRAFT

This application is a continuation application of Ser. No. 14/300,581, filed Jun. 10, 2014, which is herein incorporated by reference.

BACKGROUND INFORMATION

1. Field

The present disclosure relates generally to aircraft and, in particular, to safety analysis for aircraft. Still more particularly, the present disclosure relates to a method and apparatus for analyzing three-dimensional zones in an aircraft.

2. Background

Safety analysis may be performed for an aircraft in different stages in the life cycle of the aircraft. For example, safety analysis may be performed during the design, manufacture, certification, operation, and maintenance of the aircraft, as well as at other times in the life cycle of the aircraft.

Performing a safety analysis is a very time and resource intensive process. A great deal of work by analysts is performed to assemble data from different sources.

As part of performing a safety analysis, a three-dimensional zone analysis may be performed to determine whether an aircraft meets safety standards. The three-dimensional analysis may be, for example, a zonal safety analysis or a particular risk analysis which are types of analyses to ensure that systems within a three-dimensional zone of an aircraft meet safety standards with respect to the design and installation of the components within the zone and the cascading effects on other components that may be outside the zone. The three-dimensional zones used in zonal safety analysis may be identified in different ways.

For example, a three-dimensional zone may be identified based on physical barriers such as in aircraft and may initially consider undesirable performance from systems within the selected three-dimensional zone. The three-dimensional zones used in particular risk analysis may be identified in different ways. For example, a three-dimensional zone may be identified based on a path of destruction from an event or influence outside the systems immediately within a zone—for example, the three-dimensional path of destruction that a bird strikes, engine rotor burst, tire separation, and other such events may take through the aircraft structure and components. The effect of these types of undesired conditions for components in a zone and the cascading failure effects are identified to determine whether the systems in the aircraft or the aircraft as a whole perform as desired based on safety standards.

Different types of techniques may be used to perform the safety analysis of a three-dimensional zone. For example, failure modes and effects analysis (FMEA) is a bottom-up analysis that identifies the effects of undesired conditions on system functions and operations.

These types of analysis, however, are very labor-intensive and may have difficulty in covering a large number of undesired conditions in which different failures may occur. For example, an aircraft may have millions of parts from which an analysis may be performed. The time and effort needed to perform an analysis for every zone in an aircraft that takes into account all of the components in the aircraft are very large and complex.

Running this type of analysis on a frequent basis may be difficult with the thousands of man-hours that may be needed to perform analysis, even with the use of currently available computers and analysis programs. The potential of cascading effects through multiple components and systems may be more complex and more time-consuming than possible to run this type of analysis for an entire aircraft.

Further, with the integration of multiple functions in physical parts, the ability to perform safety analysis such as a zone safety analysis or particular risk assessment may no longer be practical because of the time and effort involved. Therefore, it would be desirable to have a method and apparatus that take into account at least some of the issues discussed above, as well as other possible issues.

SUMMARY

In one illustrative embodiment, an apparatus comprises a three-dimensional physical model of a vehicle, a logical model of the vehicle including a logical architecture linking logical components to each other, and an analyzer. The three-dimensional physical model includes geometry information and location information for physical components in the vehicle. The physical components include communications systems and electrical systems. The logical components in the logical model are mapped to the physical components in the three-dimensional physical model of the vehicle. The analyzer identifies an effect of an undesired operation of a group of physical components in a zone within the three-dimensional physical model of the vehicle based on the three-dimensional physical model and the logical model.

In another illustrative embodiment, a model based safety analysis system for an aircraft comprises a three-dimensional physical model of the aircraft, a logical model of the aircraft, a map, and an analyzer. The three-dimensional physical model includes geometry information and location information for physical components with connections to each other. The physical components include communications systems and electrical systems. The logical model of the aircraft includes a logical architecture linking logical components to each other. The logical model of the aircraft has the logical components that are mapped to the physical components in the three-dimensional physical model of the aircraft. The map identifies a correspondence between physical components in the three-dimensional physical model and logical components in the logical model. The analyzer is configured to identify effects of undesired operations of the physical components in different zones within the three-dimensional physical model of the aircraft on at least one of a group of systems in the aircraft or the aircraft as a whole based on the three-dimensional model, the logical model, and the map and identify a group of zones within the aircraft that have potentially undesirable aircraft level effects based on the effects identified for the undesired operations of the physical components.

In another illustrative embodiment, a method for zone analysis is presented. A zone is identified in a three-dimensional physical model of a vehicle. The three-dimensional physical model includes geometry information and location information for physical components. An effect of an undesired operation of a group of components in a zone within the three-dimensional physical model of the vehicle is identified based on the three-dimensional physical model of the vehicle and a logical model of the vehicle including a logical architecture linking logical components to each other. Logical components in the logical model are mapped to the physical components in the three-dimensional physical model of the vehicle.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

Figure 1:
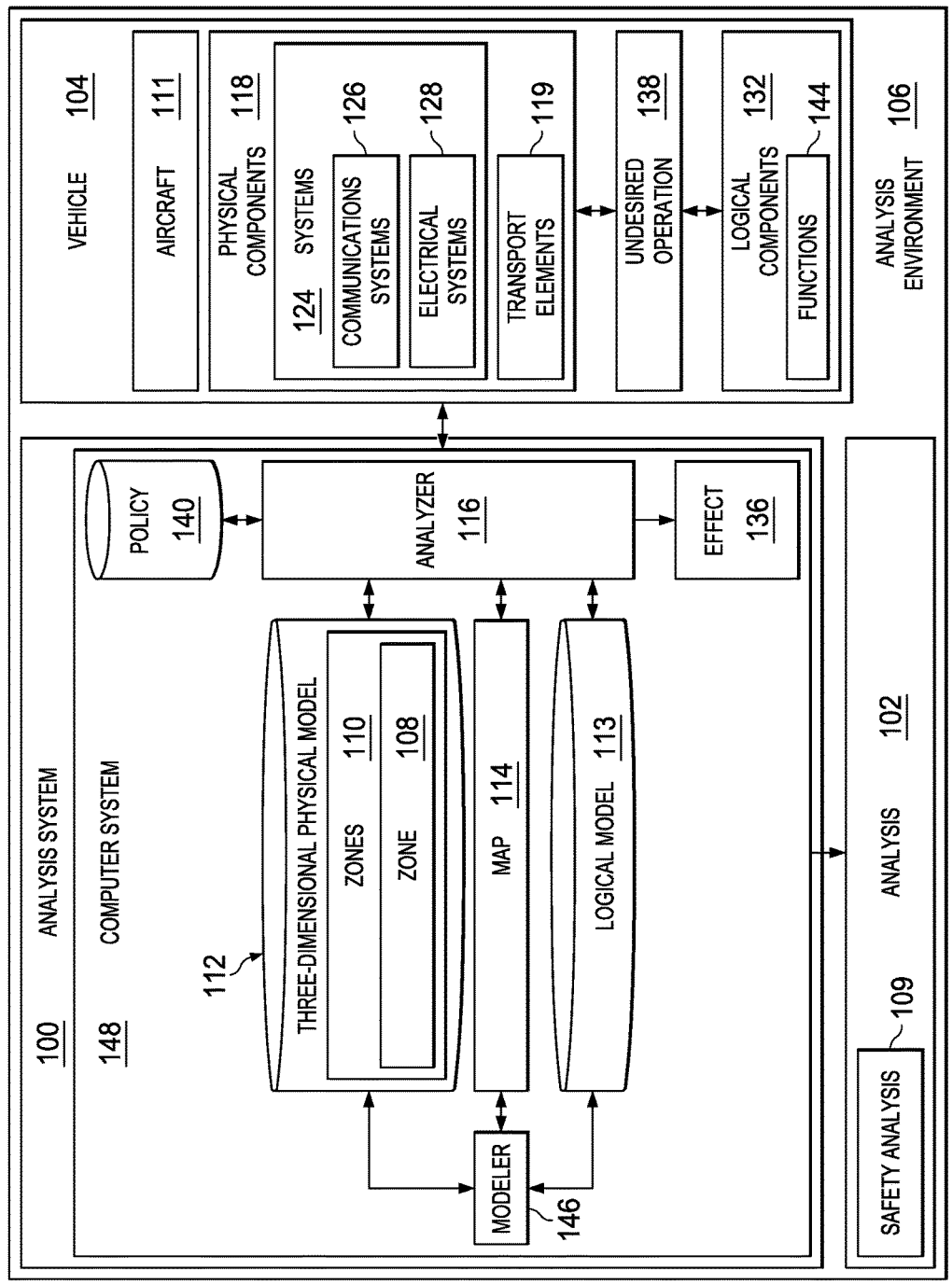
FIG. 1 is an illustration of a block diagram of an analysis environment in accordance with an illustrative embodiment.

The illustrative embodiments recognize and take into account one or more different considerations. For example, the embodiments recognize and take into account that currently available techniques for safety analysis may provide the analysis that is desired and needed, but the time and effort needed to perform the analysis may make it impractical to use these techniques as often as desired for newer aircraft.

The illustrative embodiments also recognize and take into account that the currently used analysis works well with federated systems. A federated system is a system in which one function is controlled by one system.

In a federated system, significant interactions with other systems in a larger integrated environment are not present. These systems may include, for example, flight management, communications management, analog signal consolidation and conversion to digital data, and other types of systems.

Generally these functions are loosely coupled, but in some cases the functions may be more tightly coupled. For example, an autopilot may control both horizontal and vertical flight paths. A great advantage of this type of architecture is that fault containment is inherent. Hence, a fault in the computer system or its software, supporting one function, is unlikely to propagate to other functions because there is very little that is shared between functions. Thus, system behavior, particularly during systems disturbance and failures, is relatively straightforward and easily understood and techniques can be used to detect and manage faulty or erratic data.

The illustrative embodiments also recognize and take into account that with a federated system, a one-to-one correspondence is present between a physical model of the aircraft and a logical model of the aircraft. The illustrative embodiments further recognize and take into account that with newer aircraft, integrated systems are more common. An integrated system is an integration of functions into a single system, a function in to multiple systems, or both.

The illustrative embodiments recognize and take into account that the currently used techniques for safety analysis do not work as well as desired for these types of integrated systems, especially when dependencies are present between the different systems. For example, obtaining the information from these techniques may take more time and effort than desired. The illustrative embodiments also recognize and take into account that difficulty may be present in obtaining a desired analysis when dependencies are present in the logical model of the aircraft. The logical architecture may have dependencies between various systems that increase the complexity and difficulty in performing a safety analysis on the aircraft.

Thus, the illustrative embodiments provide a method and apparatus for performing an analysis of a zone in a vehicle, such as an aircraft. In one illustrative embodiment, an apparatus comprises a three-dimensional physical model of a vehicle, a logical model of the vehicle, and an analyzer. The three-dimensional physical model of a vehicle includes geometry information and location information for physical components in the vehicle. The physical components include communications systems and electrical systems. The logical model of the vehicle includes a logical architecture linking logical components to each other. The logical components in the logical model are mapped to the physical components in the three-dimensional physical model of the vehicle. The analyzer identifies an effect of an undesired operation of a group of components in a zone within the three-dimensional physical model of the vehicle based on the three-dimensional physical model and the logical model.

The different figures and examples described herein may be implemented for use in model based safety analysis and, in particular, for model based safety analysis of zones in a vehicle. With reference now to the figures and in particular with reference to FIG. 1, an illustration of a block diagram of an analysis environment is depicted in accordance with an illustrative embodiment. Analysis system 100 may be used to perform analysis 102 on vehicle 104 in analysis environment 106. In particular, analysis 102 may be safety analysis 109 for zone 108 or other zones in zones 110.

As depicted, zones 110 are three-dimensional zones in the illustrative examples. A zone under analysis, such as zone 108, may be referred to as a threat zone.

As depicted, vehicle 104 takes the form of aircraft 111. Aircraft 111 may be in various stages in the life cycle of aircraft 111. For example, aircraft 111 may be a planned aircraft that is in the design, testing, or certification stage. In other illustrative examples, aircraft 111 may be a production aircraft that is currently in use. Analysis 102 may be performed on aircraft 111 using analysis system 100 in the different stages of the life cycle of aircraft 111.

In particular, analysis 102 may be of zone 108 in aircraft 111. In the illustrative example, analysis system 100 includes a number of different components. As depicted, analysis system 100 includes three-dimensional physical model 112, logical model 113, map 114, and analyzer 116.

In the illustrative example, analysis 102, and in particular, safety analysis 109, is a model-based analysis using three-dimensional physical model 112, logical model 113, or both of these models. These models contain information that describe various aspects of vehicle 104.

Three-dimensional physical model 112 is a model of vehicle 104. In particular this model is a three-dimensional model of physical components 118 in vehicle 104. Physical components 118 may include individual components, systems formed from individual components, or some combination thereof.

In the illustrative example, physical components 118 includes transport elements 119. The transport elements may be a component that carries items selected from at least one of a fluid, a gas, a liquid, an electrical current, or some other item that can be moved using transport elements 119. A transport element may be, for example, a fluid line, a data line, a power cable, an air duct, or some other suitable type of transport element.

As used herein, the phrase "at least one of," when used with a list of items, means different combinations of one or more of the listed items may be used and only one of each item in the list may be needed. In other words, at least one of means any combination of items and number of items may be used from the list but not all of the items in the list are required. The item may be a particular object, thing, or a category.

For example, without limitation, "at least one of item A, item B, or item C" may include item A, item A and item B, or item B. This example also may include item A, item B, and item C or item B and item C. Of course, any combinations of these items may be present. In other examples, "at least one of" may be, for example, without limitation, two of item A; one of item B; and ten of item C; four of item B and seven of item C; or other suitable combinations.

Additionally, physical components 118 may include other components that may be selected from at least one of a fastener, a skin panel, a fuselage, a spar, a rib, a wing, an engine, an engine housing, a stringer, a wing box, a seat, a cart, a monument, a computer, a hydraulics system, an entertainment system, a flight management system or some other suitable component.

As depicted in this illustrative example, physical components 118 include systems 124. Systems 124 include communications systems 126 and electrical systems 128 in this illustrative example.

Communications systems 126 are components that send information, receive information, transport information, or some combination thereof. The information may be communicated within vehicle 104 or with one or more communications systems outside of vehicle 104. Communications systems 126 may include at least one of a satellite communications system, a data processing network, a computer, a line replaceable unit, an intercom system, a sensor system, or some other suitable system. The information may include at least one of voice, data, images, commands, program code, sensor data, or other suitable types of information.

Electrical systems 128 are components that generate electricity, carry electricity or some combination thereof. Electrical systems 128 may include at least one of a power generator, an auxiliary power unit, a power cable or some other suitable component. In the illustrative example, logical model 113 of vehicle 104 is information for logical components 132 for vehicle 104.

Logical components 132 are components that have functions 144. Each logical component in logical components 132 may perform a group of functions 144. A "group of" as used herein means one or more items. For example, a group of functions is one or more functions.

Map 114 allows for correspondence between physical components 118 and logical components 132. For example, map 114 may be used to identify a logical component in logical components 132 for a physical component in physical components 118. Map 114 may be used to identify a physical component in physical components 118 for a logical component in logical components 132.

Also, physical components 118 may not have a one-to-one mapping with logical components 132. For example, a physical component may map to more than one logical component in logical components 132. In another example, a function in a logical component may be distributed to multiple ones of physical components 118. In this example, multiple physical components in physical components 118 may be identified for a logical component in logical components 132.

Also, the connections between physical components 118 may be different from the connections between logical components 132. Thus, map 114 allows for an identification of what logical components may be affected by the manner in which physical components 118 operate.

Analyzer 116 is a component that identifies effect 136 of undesired operation 138 of a group of physical components 118 in zone 108 in zones 110 within the three-dimensional physical model 112 of vehicle 104 based on three-dimensional physical model 112 and logical model 113. In these illustrative examples, effect 136 identified by analyzer 116 may be part of analysis 102.

In the illustrative example, undesired operation 138 means that one or more components, physical, logical, or both do not operate as desired. For example, the component may not operate at all or may operate at a lower level of performance than desired.

For example, undesired operation 138 in an environmental unit may mean that the environmental unit may not provide as much cooling to an area as quickly as desired or cool the area to a selected temperature. Undesired operation 138 for an aircraft engine may mean that the aircraft engine does not have a desired level of fuel efficiency. Undesired operation 138 in another example, may be an in-flight entertainment system that does not operate at all.

In the illustrative example, analyzer 116 identifies effect 136 of undesired operation 138 of the group of physical components 118 in the zone within three-dimensional physical model 112 of vehicle 104 on at least one of a group of systems 124 in vehicle 104 or vehicle 104 as a whole. As depicted, effect 136 may be on systems 124 within zone 108, outside of zone 108, or both. In still other illustrative examples, effect 136 may be on the flight crew, passengers, or other occupants in vehicle 104.

In these illustrative examples, analyzer 116 may use a number of currently available analysis techniques. Analyzer 116 includes an ability to identify logical components 132 and logical model 113 that correspond to physical components 118 in three-dimensional physical model 112 from an identification of physical components 118 located in zone 108 that is to be analyzed. With the identification of logical components 132, analysis 102 may be made more quickly and easily as compared to current processes that do not include this feature. For example, the use of logical model 113 may allow for a more accurate analysis of effect 136 on systems 124, vehicle 104, or some combination thereof.

Further, analyzer 116 also may identify functions 144 performed by logical components 132 implemented in physical components 118 located in zone 108 to determine effect 136 on undesired operation 138 of logical components 132 within zone 108. Also, cascading effects of undesired operation 138 on other physical components 118, logical components 132, or some combination thereof, also may be taken into account in identifying effect 136. In this manner, analyzer 116 also may identify whether a particular implementation of logical components 132 in a particular location in vehicle 104 may have an operation when physical components 118 in zone 108 have undesired operation 138.

Additionally, analyzer 116 determines whether effect 136 of undesired operation 138 meets policy 140 for vehicle 104. In these illustrative examples, policy 140 may be one or more rules and data. The data may be used to evaluate the rules in policy 140. In the illustrative example, policy 140 is selected from one of a standard, a safety standard, a government safety regulation, a performance standard, a requirements document, or some other suitable source or combination thereof. In other words, the application of effect 136 to policy 140 may be used to determine whether effect 136 is unacceptable with respect to systems 124, vehicle 104 as a whole, or some combination thereof.

Further, analyzer 116 may determine whether zone 108 has a potentially undesirable aircraft level effect based on policy 140 and effect 136 of undesired operation 138 of the group of physical components 118 in zone 108. In other words, zone 108, one or more zones outside of zone 108, or some combination thereof may need a change to meet policy 140.

Zone 108 may have a potentially undesirable aircraft level effect when the volume in which physical components 118 for zone 108 can be subjected to events that are generally outside of the normal events by physical components 118 in that volume in vehicle 104 such that effect 136 does not meet policy 140. Events that may cause the undesired operation with an undesired effect may include, for example, a bird strike, tread separation from a tire, a fire, leaking fluids, an engine rotor burst, a power surge, or other events not normally encountered during operation of physical components 118.

Further, analyzer 116 may determine whether effect 136 causes any of a plurality of functions 144 performed by logical components 132 in vehicle 104 to operate in an undesired manner. This identification is performed in the illustrative example using map 114. Map 114 may identify logical components 132 that correspond to physical components 118 in zone 108 as well as other zones and locations in vehicle 104.

Further, logical model 113 includes an identification of functions 144 performed by particular ones of logical components 132. In this manner, identification of physical components 118 that may be affected in zone 108 may be used to identify logical components 132, functions 144, or both that may be affected by undesired operation 138 of a group of physical components 118 in zone 108.

In the illustrative example, analyzer 116 identifies effect 136 of undesired operation 138 of the group of components 118 in zone 108 within three-dimensional physical model 112 of vehicle 104 based on a change made to a portion of at least one of three-dimensional physical model 112 or logical model 113 prior to acceptance of the change for vehicle 104. In other words, changes may be made to at least one of physical components 118 or logical components 132.

This change may be made at various times during the life cycle of vehicle 104. For example, the change may be made and evaluated by analyzer 116 during the design, refurbishment, maintenance, or other stages in the life cycle of vehicle 104. For example, changes may be made while designing vehicle 104 when analyzing effect 136 and zone 108 in analysis 102. These changes may be made to at least one of physical components 118 or logical components 132.

The changes may include, for example, moving a physical component to another location, using a different physical component in the same location, moving a logical component to another location, or some other suitable change. For example, physical components may not change, but the implementation of logical components in the physical components may be moved. For example, a logical component performing a function may be moved from one physical component to another physical component or distributed between different physical components.

When vehicle 104 is upgraded or refurbished, similar changes may be evaluated using analysis 102 generated by analysis system 100. Also, changes may be made when vehicle 104 is in for maintenance based on analysis 102. These changes may be evaluated prior to accepting the change and performing that change during maintenance of vehicle 104. Part of the acceptance may include certification, recertification, or meeting other regulatory standards or rules.

In some illustrative examples, analysis system 100 may also include modeler 146. Modeler 146 generates three-dimensional physical model 112 of vehicle 104. In other words, modeler 146 may be used to create three-dimensional physical model 112. For example, modeler 146 may be a computer aided design program or some other suitable program for generating models.

Also, modeler 146 generates the three-dimensional physical model 112 of vehicle 104 with a group of zones 110 for analysis. In other words, modeler 146 may create group of zones 110 in three-dimensional physical model 112, or may create both zones 110 and three-dimensional physical model 112. In this illustrative example, modeler 146 may also generate map 114 of a correspondence between physical components 118 and logical components 132.

Analyzer 116, modeler 146, or both may be implemented in software, hardware, firmware or a combination thereof. When software is used, the operations performed by analyzer 116 and modeler 146 may be implemented in program code configured to run on a processor unit. When firmware is used, the operations performed by analyzer 116 may be implemented in program code and data and stored in persistent memory to run on a processor unit. When hardware is employed, the hardware may include circuits that operate to perform the operations in analyzer 116 and modeler 146.

In the illustrative examples, the hardware may take the form of a circuit system, an integrated circuit, an application specific integrated circuit (ASIC), a programmable logic device, or some other suitable type of hardware configured to perform a number of operations. With a programmable logic device, the device may be configured to perform the number of operations. The device may be reconfigured at a later time or may be permanently configured to perform the number of operations. Examples of programmable logic devices include, for example, a programmable logic array, a programmable array logic, a field programmable logic array, a field programmable gate array, and other suitable hardware devices. Additionally, the processes may be implemented in organic components integrated with inorganic components and may be comprised entirely of organic components excluding a human being. For example, the processes may be implemented as circuits in organic semiconductors.

In this illustrative example, analyzer 116, modeler 146, or both may be implemented within computer system 148. Computer system 148 is a group of one or more computers. When more than one computer is present in computer system 148, those computers may communicate with each other through a communications medium such as a network. Analyzer 116, modeler 146, or both may be located on one computer or distributed among multiple computers in computer system 148.

In this manner, analysis 102 may be performed as a three-dimensional analysis of one or more zones 110 for vehicle 104. In the illustrative examples, zones 110 may be defined in three-dimensional physical model 112 of vehicle 104. Undesired operation 138 of one or more of zones 110 may be performed to determine whether any of zone 108 may have a potentially undesirable aircraft level effect. Aircraft level means the aircraft as a whole.

The performance of analysis 102 may be performed with an integrated architecture in which functions 144 performed by logical components 132 may be integrated into a single physical component in physical components 118. Further, the illustrative examples also may take into account that some transport elements such as data lines in networks may be connected to multiple physical components in physical components 118. The identification of how data flows may not be apparent from examining or analyzing three-dimensional physical model 112. In the illustrative examples, analyzer 116 identifies logical components 132 in response to an identification of physical components 118 in zone 108 that have undesired operation 138 using map 114. The use of both three-dimensional physical model 112 and logical model 113 with map 114 allows for a more efficient and faster analysis of effect 136 of undesired operation 138 of physical components 118 located in zone 108.

With analysis system 100, proposed changes to three-dimensional physical model 112 may be analyzed prior to accepting those changes in three-dimensional physical model 112. In this manner, various scenarios may be identified to identify multiple changes that may be feasible for vehicle 104 based on policy 140.

When multiple changes are identified as being useable, one of those changes may be selected based on other parameters such as cost, weight, performance, or other suitable parameters. In this manner designing, refurbishing, upgrading, or performing other operations that involve designing components, architectures, or both for vehicle 104 may be performed more easily as compared to using currently available analysis techniques for three-dimensional analysis of zones 110.

Figure 2:
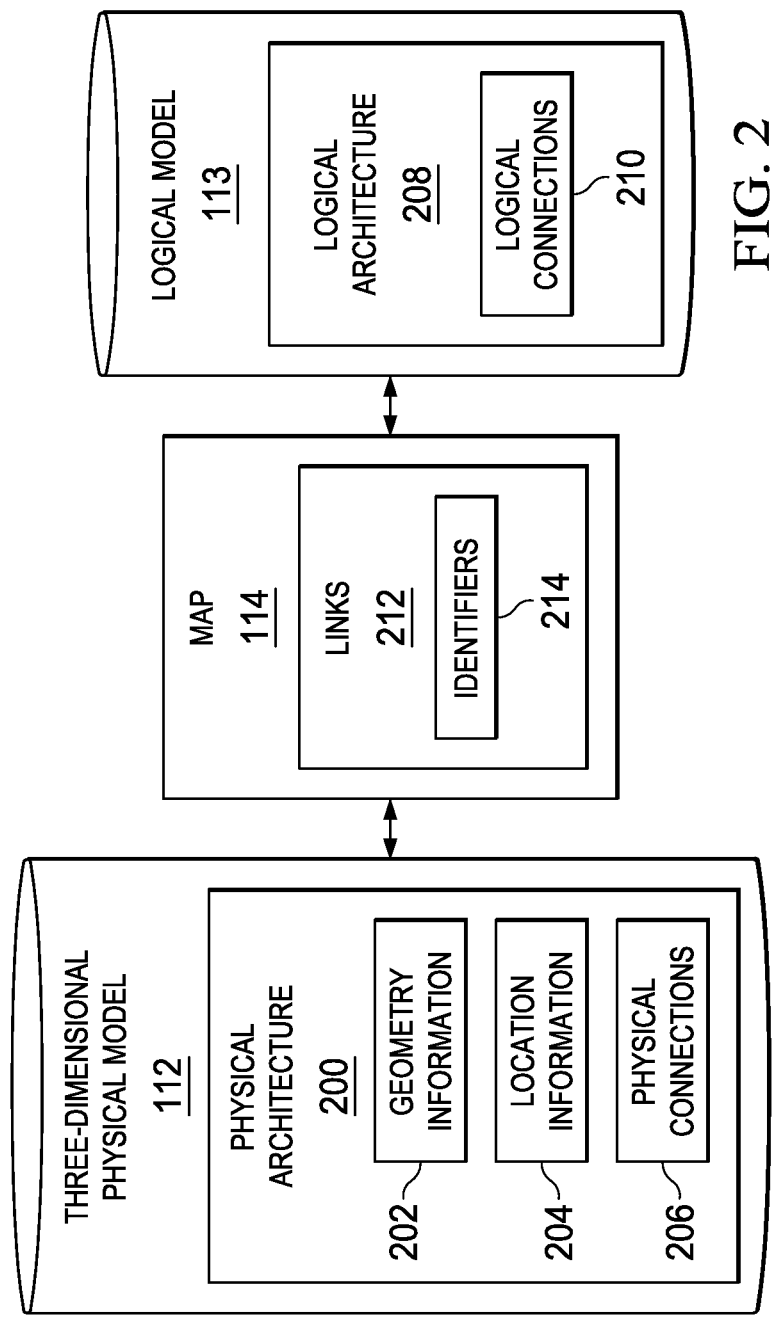
FIG. 2 is a more detailed illustration of a three-dimensional physical model and a logical model in the form of a block diagram in accordance with an illustrative embodiment.

Turning now to FIG. 2, a more detailed illustration of a three-dimensional physical model and a logical model is depicted in the form of a block diagram in accordance with an illustrative embodiment. Three-dimensional physical model 112 and logical model 113 are shown in greater detail in this figure.

Three-dimensional physical model 112 has physical architecture 200. As depicted, physical architecture 200 includes geometry information 202 and location information 204 for physical components 118 in vehicle 104 as shown in FIG. 1. In other words, geometry information 202 and location information 204 describes physical components 118 in vehicle 104.

In the illustrative examples, three-dimensional physical model 112 may be a computer added design (CAD) model for vehicle 104 or in any other format that allows for the description of physical components 118 in vehicle 104 using geometry information 202 and location information 204 about physical components 118.

Geometry information 202 in three-dimensional physical model 112 describes the shapes of physical components 118 in vehicle 104. These shapes described by geometry information 202 may be implemented using at least one of mathematical equations, coordinates, meshes shells, surfaces, solids, boundaries, or other techniques used to define shapes in three dimensions.

In the illustrative example, location information 204 describes where physical components 118 are located and, in particular, the position of physical components 118 in vehicle 104. The positions of physical components 118 may be described using a coordinate system. The coordinate system may have a reference point within vehicle 104 or outside of vehicle 104. This reference point may be an origin for vehicle 104.

Additionally, location information 204 also may describe orientations of physical components 118. The orientations describe the direction that physical components 118 face in vehicle 104. The directions faced may be with respect to one or more features on physical components 118. These features may be a point or vector on a surface of a component or a physical feature on a component.

Additionally, physical architecture 200 in three-dimensional physical model 112 also may include physical connections 206. Physical connections 206 with physical components 118 may be connected directly to each other or indirectly connected to each other using components such as transport elements 119.

In the illustrative example, logical model 113 has logical architecture 208 for logical components 132 in vehicle 104. As depicted, logical architecture 208 links logical components 132, shown in FIG. 1, to each other. In this illustrative example, logical architecture 208 includes logical connections 210. Logical connections 210 in logical architecture 208 links logical components 132 to each other. In particular, logical connections 210 identify a flow of items through transport elements 119, shown in FIG. 1. The flow of elements are not easily identifiable using three-dimensional physical model 112. As a result, the use of logical model 113 in conjunction with three-dimensional physical model 112 and analysis 102 is formed more quickly as compared to currently available techniques.

With the identification of a flow of items through transport elements 119, analysis 102 of effect 136 may take into account what particular physical components or logical components to which the items flow. In this manner, analysis 102 may be made more easily and feasibly as compared to currently used techniques for performing this type of analysis.

In these illustrative examples, map 114 may be used to identify the correspondence between physical components 118 described by three-dimensional physical model 112 and logical components 132 described by logical model 113. In other words, modeler 146 may generate map 114 to establish the correspondence between three-dimensional physical model 112 and logical model 113 for use in analysis 102.

In the illustrative example, the correspondence is identified using links 212. Links 212 provide connections between physical components 118 and logical components 132 described by these models.

In the illustrative example, links 212 may include identifiers 214 and may be assigned to physical components 118 and logical components 132 to indicate the correspondence. An identifier may be a common attribute between the components. This common attribute may be, for example, a part number, a reference number, a serial number, or some other identifier. The identifier may be unique within vehicle 104 or may be unique between multiple vehicles.

Thus, when a physical component in physical components 118 is identified in three-dimensional physical model 112, the corresponding logical component in logical components 132 may be identified in logical model 113 using links 212 in map 114. In a similar fashion, identification of a logical component may be used to identify a physical component. In some cases, more than one physical component may correspond to a particular logical component and more than one logical component may correspond to a particular physical component. For example, multiple ones of logical components 132 may be loaded on a single computer in physical components 118.

The illustration of analysis environment 106 and the different components in this environment in FIG. 1 and FIG. 2 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, vehicle 104 may take other forms other than aircraft 111. For example, vehicle 104 may be selected from one of a mobile platform, a surface ship, a tank, a personnel carrier, a train, a spacecraft, a submarine, a bus, an automobile, or some other type of vehicle 104.

As another example, systems 124 may include other systems in addition to or in place of communications systems 126 and electrical systems 128. For example, systems 124 may also include at least one of a hydraulics system, a ventilation system, a fire suppression system, or other suitable types of systems 124.

Also, analysis 102 may include other types of analysis in addition to or in place of safety analysis 109. For example, analysis 102 may be an environmental impact analysis of vehicle 104 in addition to or in place of safety analysis 109. As another illustrative example, physical components 118 may be described to form systems 124 instead of including systems 124.

Figure 3A:
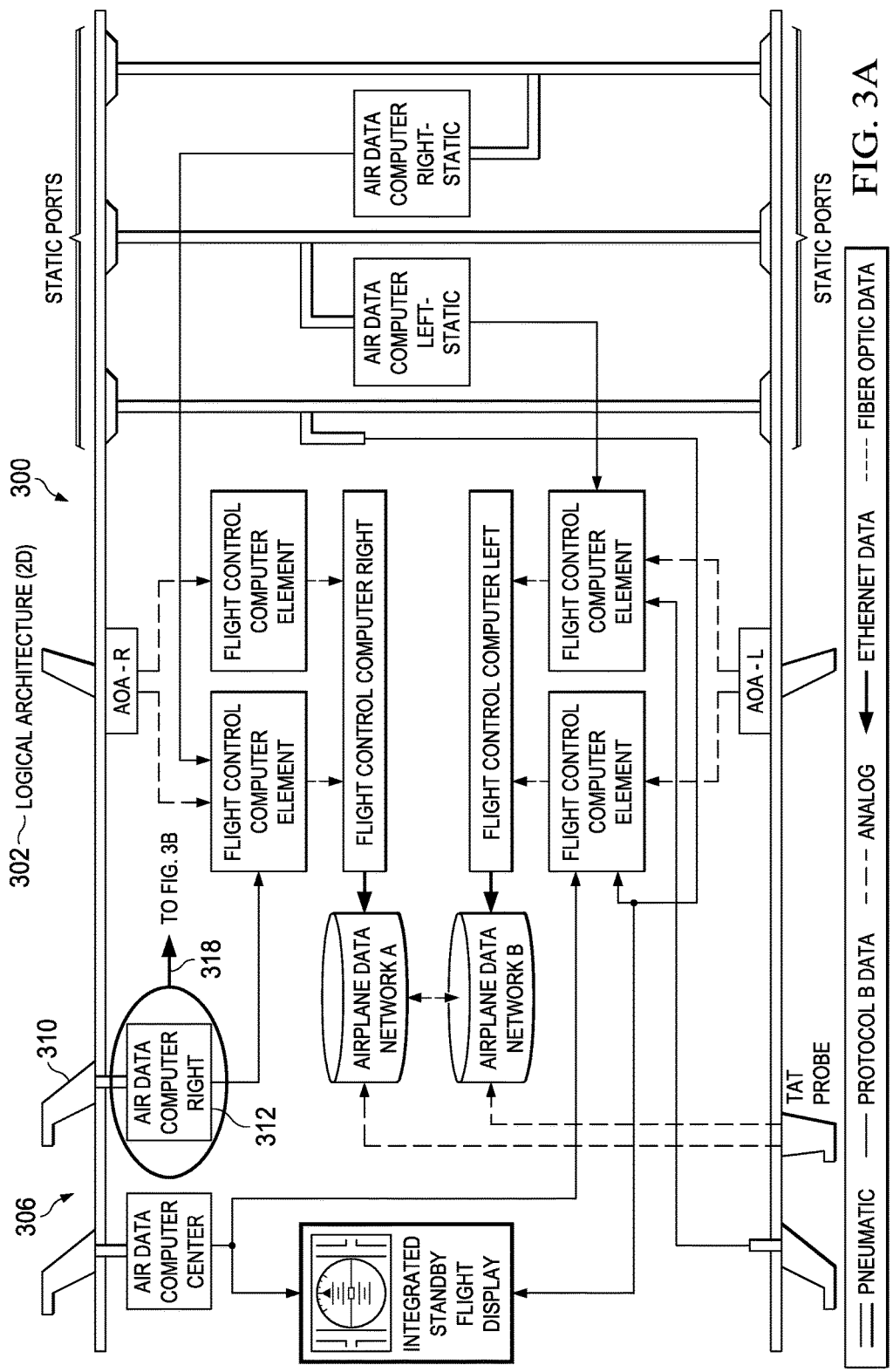
FIG. 3A and FIG. 3B are illustrations of a logical architecture and physical architecture for an aircraft in accordance with an illustrative embodiment.
Figure 3B:
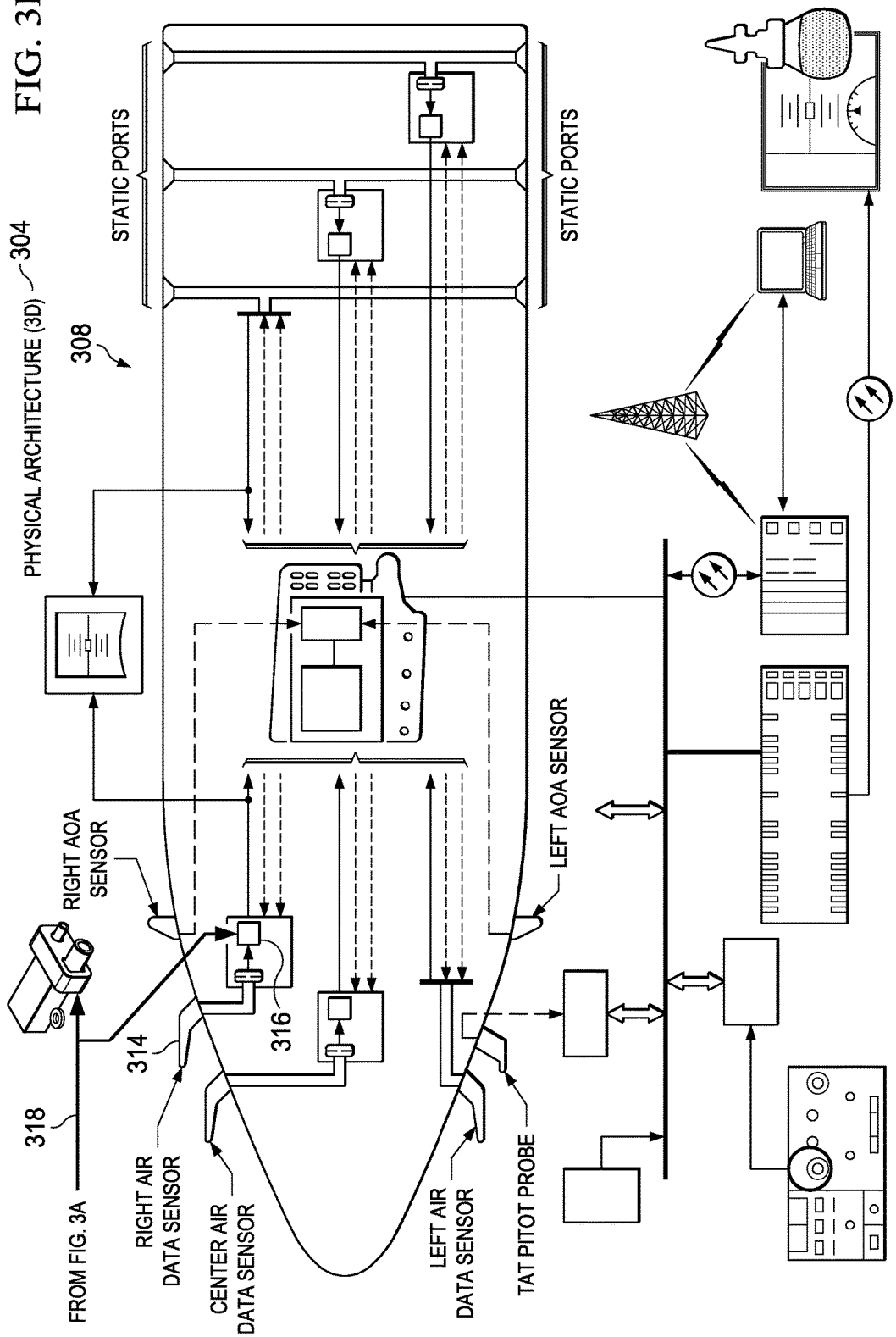

With reference next to FIG. 3A and FIG. 3B, illustrations of a logical architecture and a physical architecture for an aircraft are depicted in accordance with an illustrative embodiment. In this illustrative example, display 300 shows logical architecture 302 and physical architecture 304. In this example, display 300 is generated by computer system 148, shown in FIG. 1.

As depicted, logical architecture 302 is an example of a visual representation of logical architecture 208 shown in block form in FIG. 2. Physical architecture 304 is a visual representation of physical architecture 200 shown in block form in FIG. 2.

As can be seen, logical components 306 are shown in logical architecture 302. Also, physical components 308 are shown in physical architecture 304.

In some cases, logical components 306 may have corresponding physical components 308. For example, air data modules, such as air data sensor R 310 and air data module R 312 are shown in logical components 306. Corresponding physical components are present in physical components 308. These corresponding components are air data sensor R 314 and air data module R 316.

The location of air data module R 310 in logical architecture 304 and the corresponding components, location air data module R 314, in physical architecture 304 are different. In this example, physical components 308 are shown in locations that correspond to where physical components may be found in an aircraft. Logical components 306 may not reflect the actual location of where the logical components may be located in the aircraft. As a result, identifying logical components that may be present in a zone defined in physical architecture 304 may be more difficult than desired because the two architectures do not show components in the same corresponding locations.

The illustrative example includes link 318 between the logical component, between air data module R 312 in logical architecture 302 and air data module R 316 in physical architecture 302. Link 318 is a visualization of a link in links 212 in FIG. 2, in the form of a graphical indicator.

Thus, an operator may identify air data module R 316 in physical architecture 302 as being located in a zone with other physical components. The corresponding logical component, air data module R 312, is identified by link 318.

The illustration of display 300 is not meant to limit the manner in which different illustrative embodiments may be implemented. For example, link 318 is shown as a line that extends between the two components and encircles the two components. In other illustrative examples, the components identified as corresponding to each other may be indicated using a graphical indicator such as highlighting, flashing text, color, icons, or using other suitable graphical indicators.

Further, in other illustrative examples, one-to-one correspondence between logical components and physical components may not be present. For example, two logical components in logical architecture 302 may be located in a single physical component in physical architecture 304. In still other illustrative examples, a single logical component in logical architecture 302 may be distributed between two or more physical components in physical architecture 304.

Figure 4:
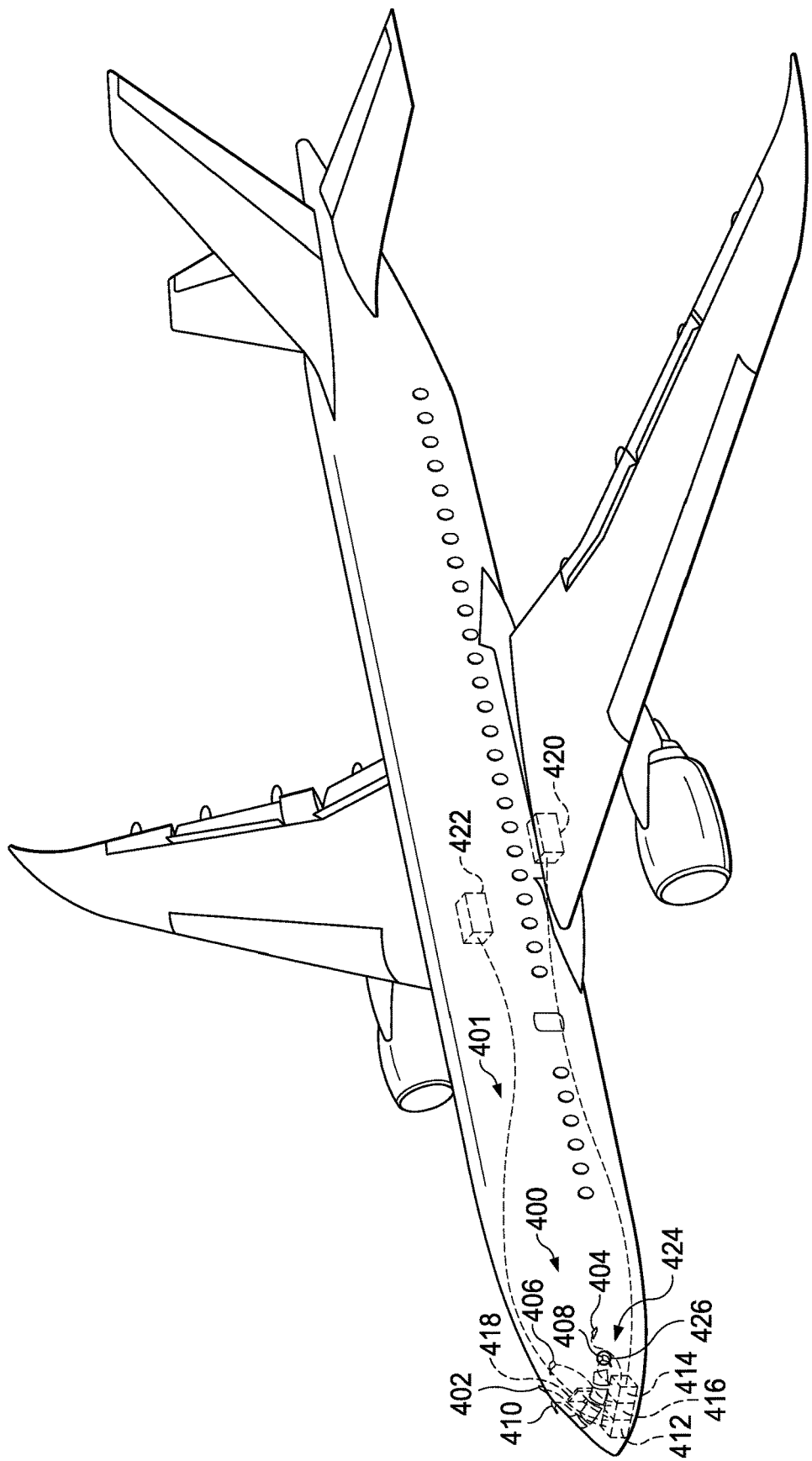
FIG. 4 is an illustration of a three-dimensional physical model of a portion of an aircraft in accordance with an illustrative embodiment.

With reference next to FIG. 4, an illustration of a three-dimensional physical model of a portion of an aircraft is depicted in accordance with an illustrative embodiment. In this illustrative example, display 400 is a display of a portion of aircraft 111 shown in block form in FIG. 1. Display 400 is a display generated by computer system 148 and is a visual representation of three-dimensional physical model 112.

In this example, various sensors are shown on surface 401 of aircraft 111. As depicted, the sensors include angle of attack sensor right 402, angle of attack sensor left 404, air data sensor right 406, air data sensor left 408, and air data sensor center 410.

Also seen in this view is air data computer left 412, air data computer right 414, air data computer center 416, flight display 418, flight control computer right 420, and flight control computer left 422. Cables 424 connecting the different components are also shown. These cables are examples of transport elements.

In this particular example, zone 426 is identified in aircraft 111. Zone 426 is an example of a physical implementation of zone 108 shown in block form in FIG. 1.

As depicted, zone 426 is a three-dimensional zone. In other words, zone 426 is a volume. Zone 426 may be defined in a number of different ways. For example, zone 426 may be defined using structures in aircraft 111. These structures may be, for example, a fuselage, a skin panel, a bulkhead, or other suitable structures. In other illustrative examples, zone 426 may be selected by an operator.

As depicted in this example, zone 426 includes air data sensor left 408 as well as other components not shown in this view. A three-dimensional analysis of zone 426 may be performed using analysis system 100 in FIG. 1. This analysis identifies the effect of an operation of air data sensor left 408 and may also include an effect of the operation of other components that may operate in the same or other zones in zone 426.

The undesired operation of air data sensor left 408 in zone 426 may be a result of an event. This event may be, for example, a bird strike, an electromagnetic event, or some other suitable event.

Figure 5:
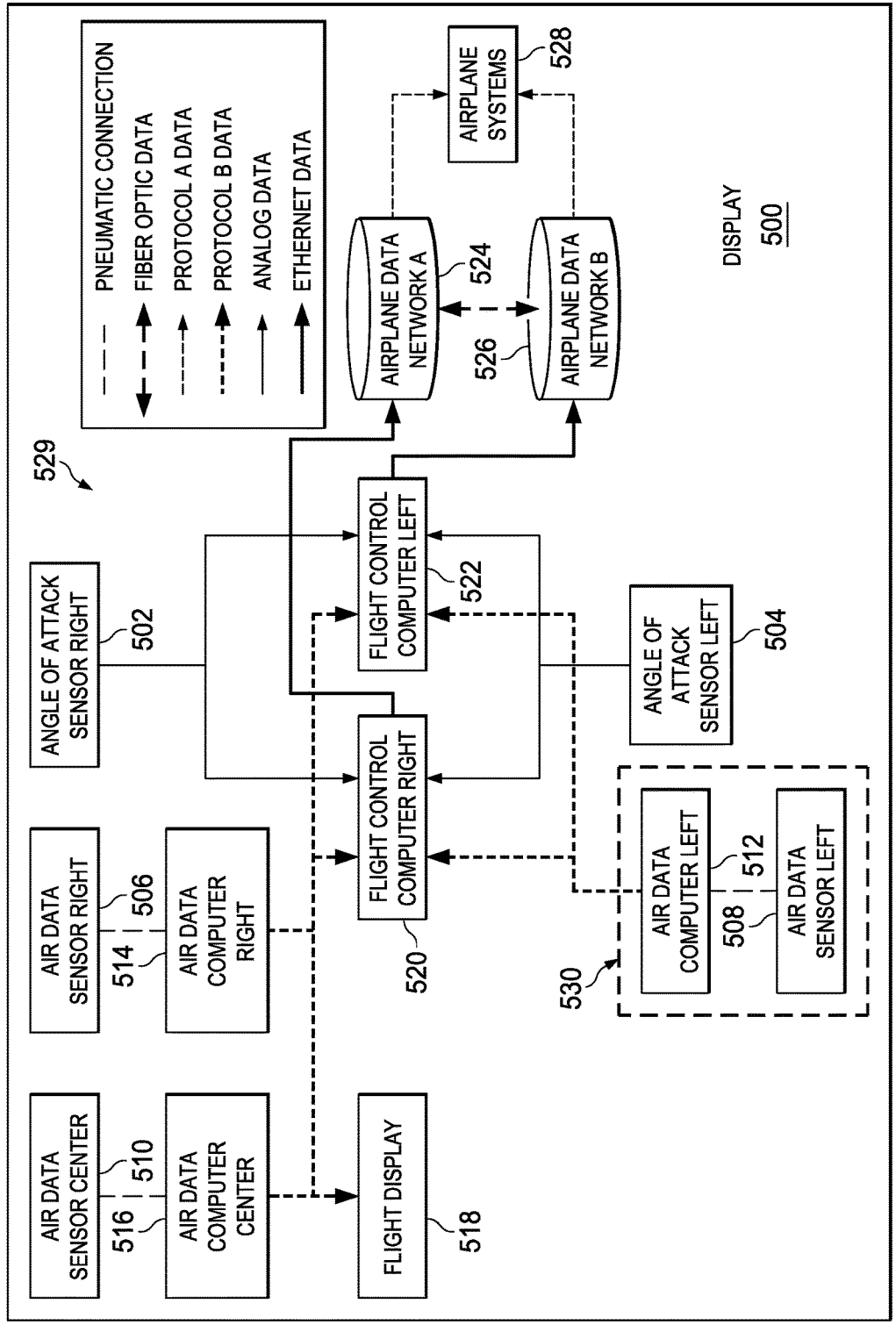
FIG. 5 is an illustration of a logical model of an aircraft in accordance with an illustrative embodiment.

With reference next to FIG. 5, an illustration of a logical model of an aircraft is depicted in accordance with an illustrative embodiment. In this illustrative example, display 500 is a display of a portion of logical model 113 for aircraft 111 in FIG. 1. Display 500 is a display generated by computer system 148 and is a visual representation of a portion of logical model 113.

As depicted, logical model 113 includes angle of attack sensor right 502, angle of attack sensor left 504, air data sensor right 506, air data sensor left 508, and air data sensor center 510. The sensors shown in this block diagram representing angle of attack sensor right 402, angle of attack sensor left 404, air data sensor right 406, air data sensor left 408, and air data sensor center 410 are shown as physical components in FIG. 4.

Additionally, display 500 also shows air data computer left 512, air data computer right 514, air data computer center 516, flight display 518, flight control computer right 520, flight control computer left 522, airplane data network A 524, airplane data network B 526, and airplane systems 528. Further, display 500 also shows data flows 529 in logical model 113 in FIG. 1.

In this illustrative example, zone 530 is depicted. This zone corresponds to zone 426 shown in display 400 in FIG. 4. As can be seen, an undesired operation of air data sensor left 508 in zone 530 may result in incorrect air data or no air data being generated by air data computer left 512. The air data is sent to both flight control computer right 520 and flight control computer left 522 is a logical view of logical model 113.

As can be seen, a comparison of cables 424 and data flows 529 demonstrate the usefulness of logical model 113 with three-dimensional physical model 112. This comparison also may allow that the proper level of component redundancy remains to ensure adequate functionality. In performing safety analysis 109 in FIG. 1, three-dimensional physical model 112 may have an undesired level of difficulty, time, and other undesired factors when logical model 113 is not used to perform safety analysis 109. As can be seen, cables 424 do not show where the air data generated by air data computer left 412 flows from the connections of cables 424 from air data computer left 412 to flight control computer right 420 and flight control computer left 422. Further, connections of flight control computer right 420 and flight control computer left 422 to airplane data network A 524 and airplane data network B 526 are shown without any indication of how the air data generated by air data computer left 512 flows to different systems in aircraft.

In other words, the components that will receive the air data cannot be identified from display 400 of three-dimensional physical model 112 in FIG. 4. For example, the air data could flow from air data computer left 412 to flight control computer right 420, flight control computer left 422, or to both components based on three-dimensional physical model 112.

But with logical model 113 as displayed in FIG. 5, data flows 529 are shown for the different logical components. In this illustrative example, data flows 529 show that air data from air data computer left 512 flows to the flight control computer right 520 and flight control computer left 522. Further, data flows 529 also show that this air data is also sent to airplane systems utilizing data.

In the illustrative examples, air data sensor left 408 is identified as being present in zone 426 in FIG. 4. This component is identified as having an undesired operation. The effect of this undesired operation on other components can be identified using logical model 113 as displayed in FIG. 5.

A one-to-one correspondence between physical components and logical components are not always present. Air data sensor left 508 is identified using a map such as map 114. Based on the identification of air data sensor left 508, other components that are affected by the undesired operation of air data sensor left can be identified.

In this manner, an identification of an effect on at least one of physical components or logical components can be made. The analysis can be used to determine whether the undesired operation results in an unacceptable operation of other components, systems, or the vehicle as a whole. This identification and analysis made be made more quickly and more easily as compared to currently used techniques for three-dimensional analysis of a zone in a vehicle, such as an aircraft.

The illustration of displays from these physical models is not meant to imply limitations to the manner in which different illustrative embodiments may be implemented. For example, other illustrative examples may show other types of transport elements other than wires, optical fibers, or other transport elements that transport information. In another illustrative example, the transport elements may take the form of conduits that carry fluids in which the flow of the fluids may be controlled using valves.

Figure 6:
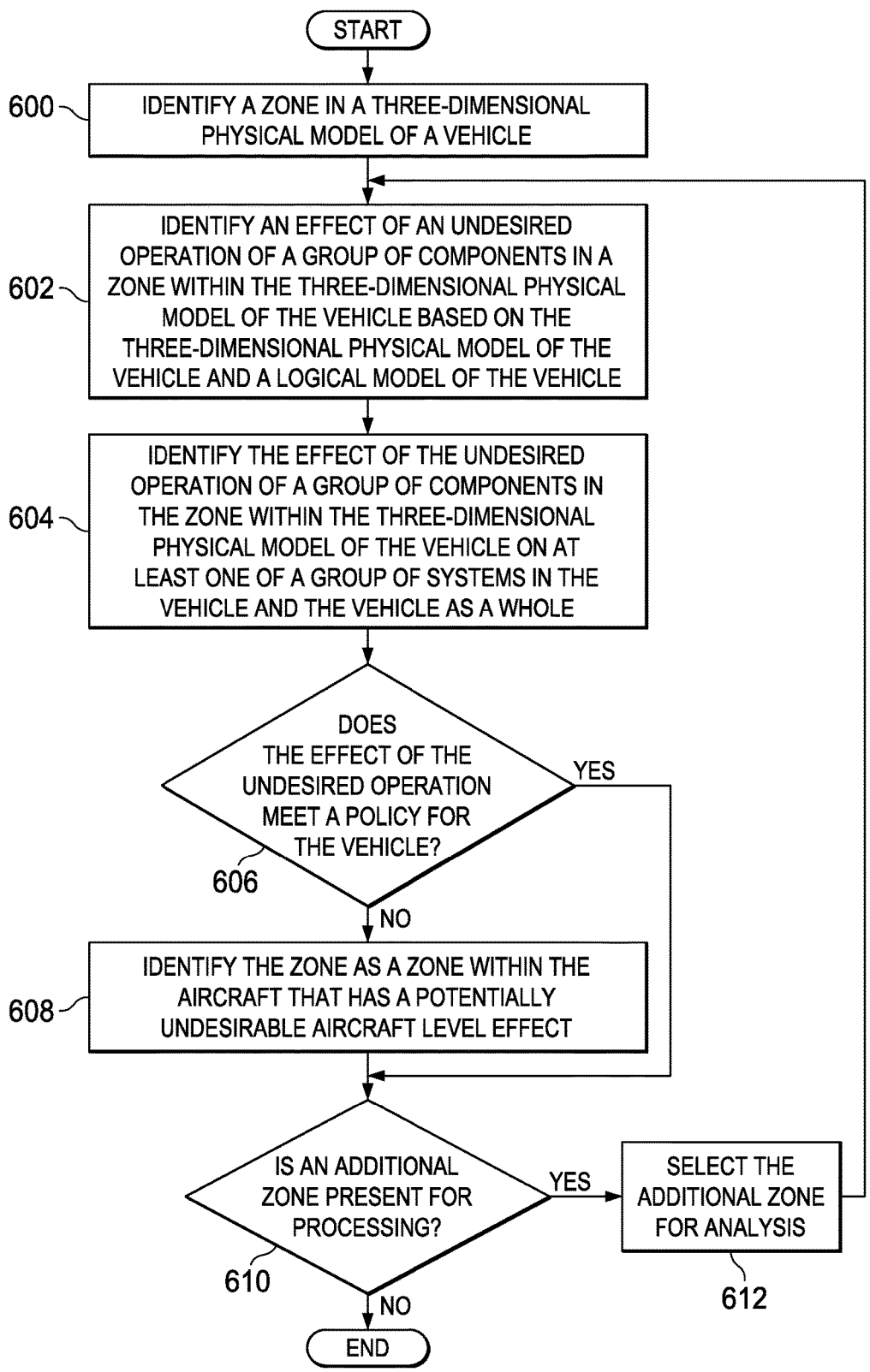
FIG. 6 is an illustration of a flowchart of a process for zone analysis in accordance with an illustrative embodiment.

With reference to FIG. 6, an illustration of a flowchart of a process for zone analysis is depicted in accordance with an illustrative embodiment. The operations illustrated in FIG. 6 may implemented in analysis system 100 in FIG. 1 and in particular may be implemented in analyzer 116 in FIG. 1.

The process begins by identifying a zone in a three-dimensional physical model of a vehicle (operation 600). An effect of an undesired operation of a group of components in a zone within the three-dimensional physical model of the vehicle based on the three-dimensional physical model of the vehicle and a logical model of the vehicle is identified (operation 602). In identifying the effect, the process may determine whether the effect causes any of a plurality of functions performed by the logical components in the vehicle to operate in an undesired manner.

The process then identifies the effect of the undesired operation of a group of components in the zone within the three-dimensional physical model of the vehicle on at least one of a group of systems in the vehicle and the vehicle as a whole (operation 604). The effect may include a cascading effect in which undesired operation may cause other components in a chain to operate in an undesired manner.

Next, a determination is made as to whether the effect of the undesired operation meets a policy for the vehicle (operation 606). In the illustrative example, the policy is selected from one of a standard, a safety standard, a government safety regulation, a performance standard, and a requirements document. If the effect does not meet the policy, the zone is identified as a zone within the aircraft that has a potentially undesirable aircraft level effect (operation 608). Next, the process determines whether an additional zone is present for processing (operation 610). If an additional zone is not present, the process terminates. Otherwise, the process selects the additional zone for analysis (operation 612) and proceeds to operation 602. With reference again to operation 606, if the effect does meet the policy, the process also proceeds to operation 610.

Figure 7:
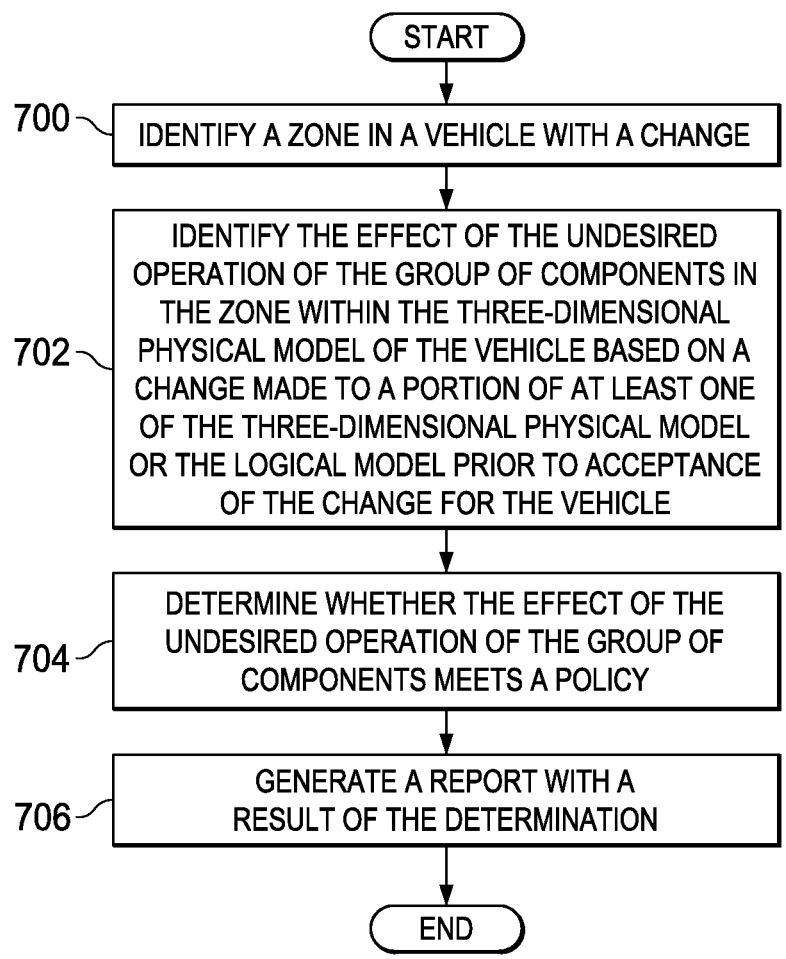
FIG. 7 is an illustration of a flowchart of a process for zone analysis of changes to a vehicle in accordance with an illustrative embodiment.

Turning to FIG. 7, an illustration of a flowchart of a process for zone analysis of changes to a vehicle is depicted in accordance with an illustrative embodiment. The operations illustrated in FIG. 7 may implemented in analysis system 100 in FIG. 1 and in particular may be implemented in analyzer 116 in FIG. 1.

The process begins by identifying a zone in a vehicle with a change (operation 700). In the illustrative example, the change may be to at least one of a group of components or a system in at least one of the three-dimensional physical model or the logical model. The change may be located in the zone or outside of the zone. When more than one change is present, a portion of the change may be located within the zone. The change may be, for example, a change in a component, a location of a component, a flow of data, a function of a logical component or some other suitable change.

The process then identifies the effect of the undesired operation of the group of components in the zone within the three-dimensional physical model of the vehicle based on a change made to a portion of at least one of the three-dimensional physical model or the logical model prior to acceptance of the change for the vehicle (operation 702).

The process then determines whether the effect of the undesired operation of the group of components meets a policy (operation 704). A report is generated with a result of the determination (operation 706), with the process terminating thereafter. A human operator may decide whether to accept the change. For example, if the effect meets the policy, the human operator may accept the change. If the effect does not meet the policy, the human operator may reject the change.

Figure 8:
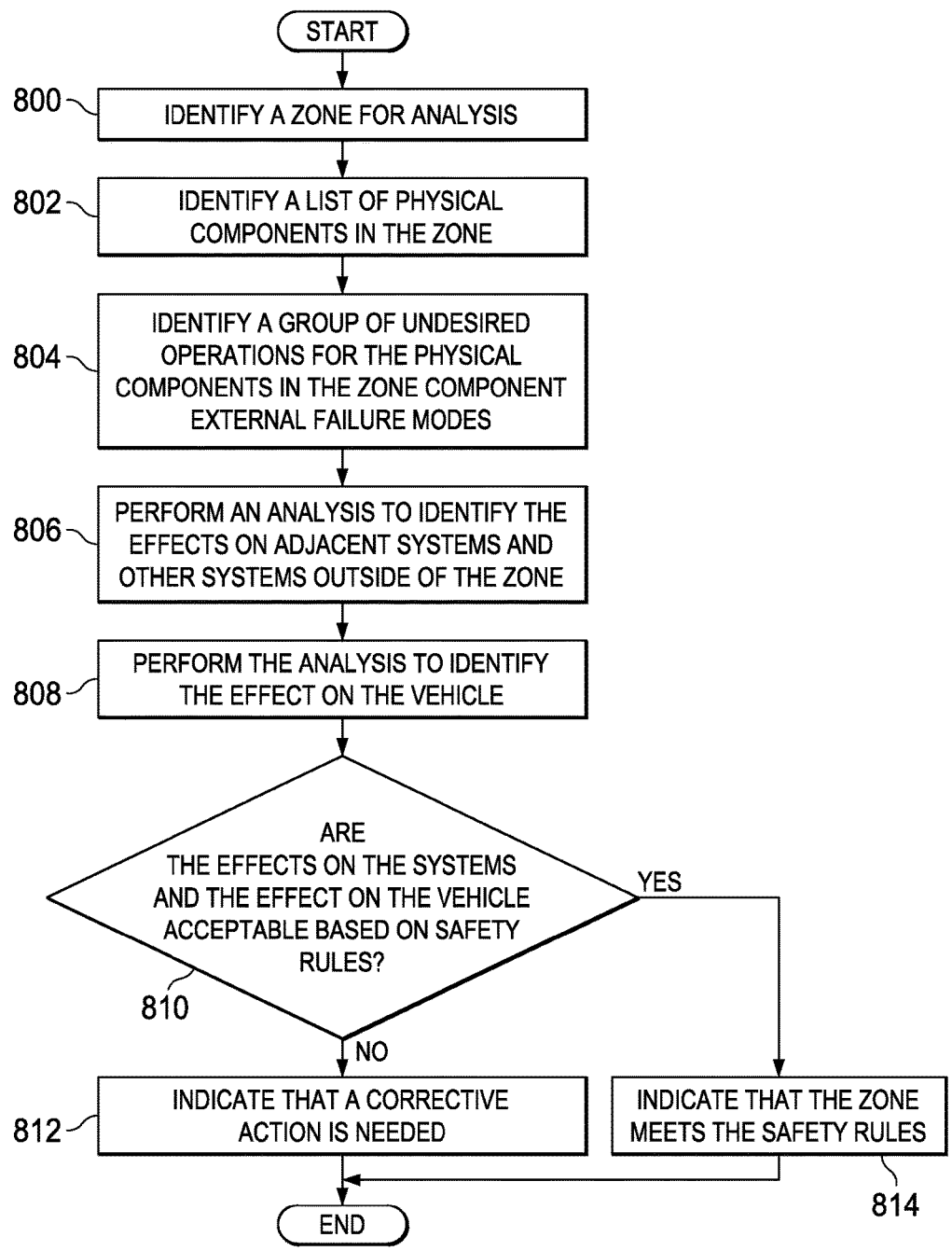
FIG. 8 is an illustration of a flowchart of a process for zonal safety analysis in accordance with an illustrative embodiment.

Turning now to FIG. 8, an illustration of a flowchart for zonal safety analysis is depicted in accordance with an illustrative embodiment. In this illustrative example, the process is for a model based three-dimensional analysis of a zone in a vehicle. The process in FIG. 8 may be performed in analysis environment 106 in FIG. 1. In particular, the process may be implemented in analyzer 116 in FIG. 1.

In this illustrative example, a zonal safety analysis (ZSA) may be performed for vehicle 104. This analysis is performed to ensure that physical components 118 in vehicle 104 need safety standards. These standards may be with respect to design and installation standards, interference between systems, maintenance errors, and factors.

The process begins by identifying a zone for analysis (operation 800). The process then identifies a list of physical components in the zone (operation 802). The process then identifies a group of undesired operations for the physical components in the zone (operation 804).

The process then performs an analysis to identify the effects on adjacent systems and other systems outside of the zone (operation 806). These effects may include an identification of whether or how the other systems operate when component external failure modes are applied to components in the zone. The process then performs the analysis to identify the effect on the vehicle (operation 808). The effect on the vehicle may include how the vehicle performs as a whole rather than individual systems or groups of systems in the vehicle. The effect on the vehicle as a whole may be referred to as a vehicle level effect.

A determination is made as to whether the effects on the systems and the effect on the vehicle are acceptable based on safety rules (operation 810). If the effects on the systems and effect of the vehicle are not acceptable, the process indicates that a corrective action is needed (operation 812). This corrective action may involve making a modification to one or more physical components in the zone or other physical components outside of the zone. In other examples, the corrective action may be a modification to one or more logical components in addition to or in place of the one or more physical components.

Otherwise, the process indicates that the zone meets the safety rules (operation 814) with the process terminating thereafter. This process may be performed for any number of zones identified for the vehicle. Further, this process may be performed prior to a change being made to the design of the vehicle or implementing an actual change that has been designed for the vehicle.

Figure 9:
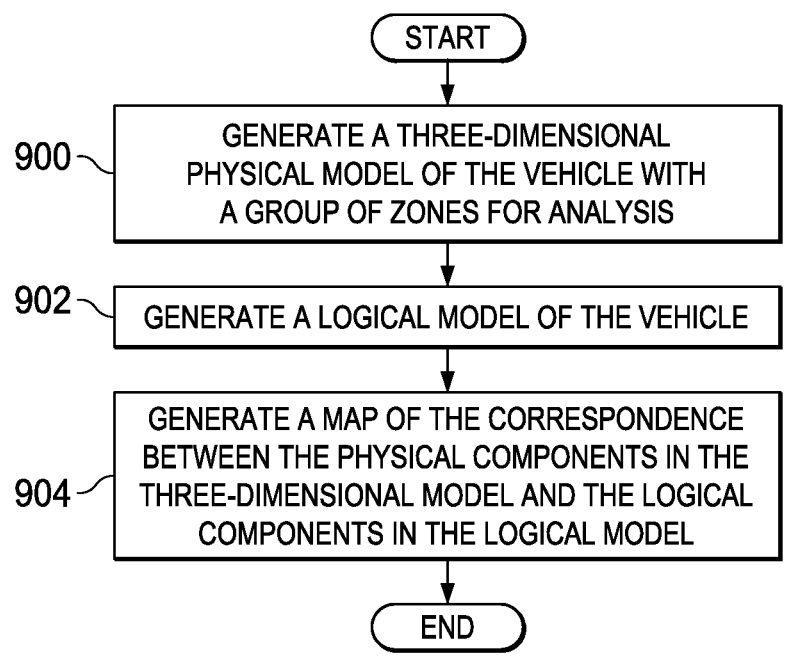
FIG. 9 is an illustration of a flowchart of a process for generating models and maps between models for a vehicle in accordance with an illustrative embodiment.

With reference next to FIG. 9, an illustration of a flowchart of a process for generating models and maps between models for a vehicle is depicted in accordance with an illustrative embodiment. The process in FIG. 9 may be implemented in analysis environment 106 in FIG. 1 and may be implemented in analysis system 100 in FIG. 1. In particular, the process may be implemented in modeler 146 in FIG. 1.

The process begins by generating a three-dimensional physical model of the vehicle with a group of zones for analysis (operation 900). Next, the process generates a logical model of the vehicle (operation 902). The process then generates a map of the correspondence between the physical components in the three-dimensional model and the logical components in the logical model (operation 904), with the process terminating thereafter.

In the illustrative examples, the map could be formed in a number of different ways. For example, each physical component may have an attribute including the logical component identifier. Each logical component may have an attribute with the physical component identifier, X/Y/Z location, the current zone if broken down at that point in the program. The mapping of logical component information through transport elements may be related to those components.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent at least one of a module, a segment, a function, or a portion of an operation or step. For example, one or more of the blocks may be implemented as program code, in hardware, or a combination of the program code and hardware. When implemented in hardware, the hardware may, for example, take the form of integrated circuits that are manufactured or configured to perform one or more operations in the flowcharts or block diagrams. When implemented as a combination of program code and hardware, the implementation may take the form of firmware.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram. For example, operation 900 and operation 902 may be performed in reverse order or at substantially the same time.

Figure 10:
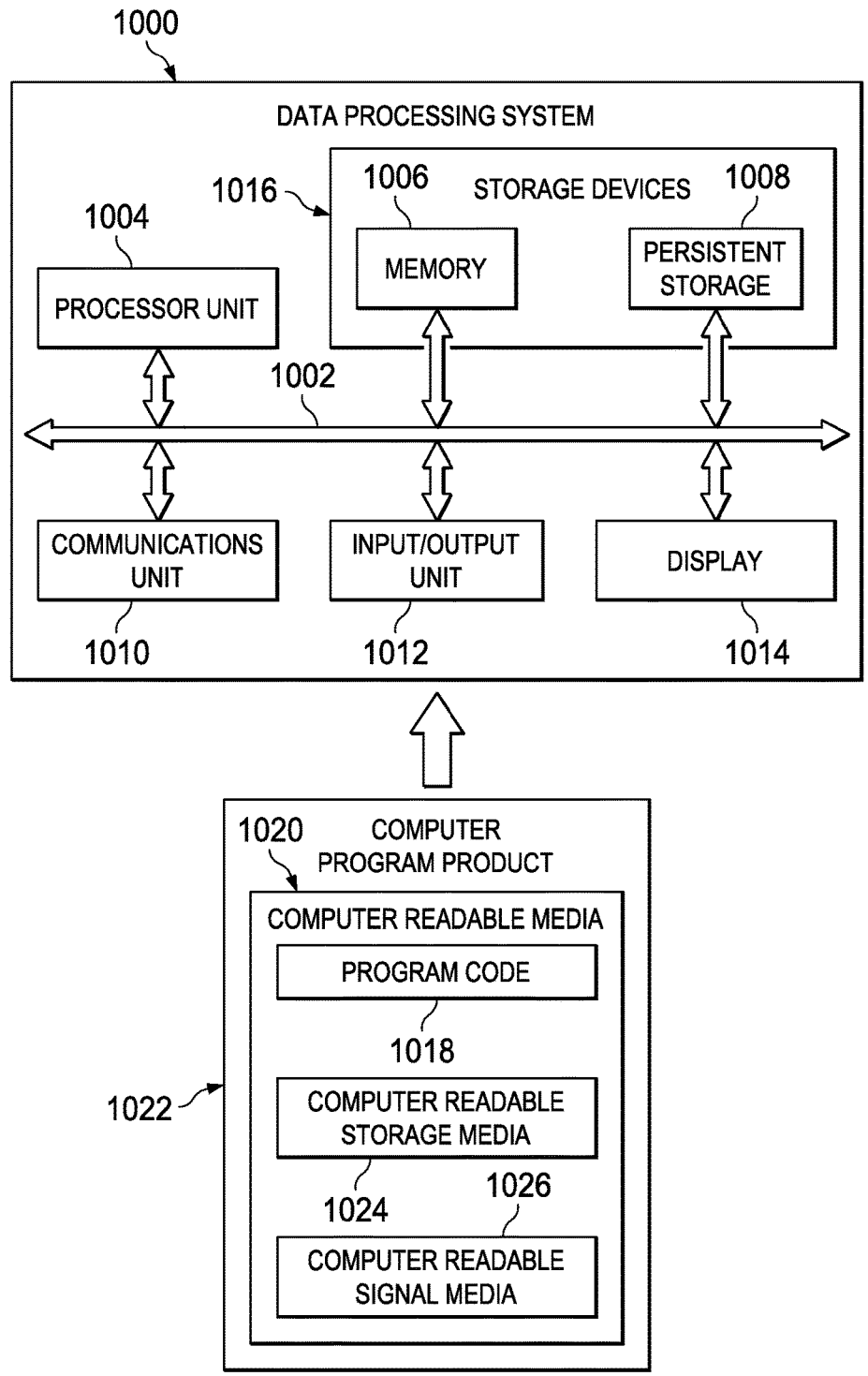
FIG. 10 is an illustration of a data processing system in the form of a block diagram in accordance with an illustrative embodiment.

Turning now to FIG. 10, an illustration of a data processing system in the form of a block diagram is depicted in accordance with an illustrative embodiment. Data processing system 1000 may be used to implement one or more computers in computer system 148 in FIG. 1. As depicted, data processing system 1000 includes communications framework 1002, which provides communications between processor unit 1004, storage devices 1016, communications unit 1010, input/output unit 1012, and display 1014. In some cases, communications framework 1002 may be implemented as a bus system.

Processor unit 1004 is configured to execute instructions for software to perform a number of operations. Processor unit 1004 may comprise a number of processors, a multi-processor core, and/or some other type of processor, depending on the implementation. In some cases, processor unit 1004 may take the form of a hardware unit, such as a circuit system, an application specific integrated circuit (ASIC), a programmable logic device, or some other suitable type of hardware unit.

Instructions for the operating system, applications, and/or programs run by processor unit 1004 may be located in storage devices 1016. Storage devices 1016 may be in communication with processor unit 1004 through communications framework 1002. As used herein, a storage device, also referred to as a computer readable storage device, is any piece of hardware capable of storing information on a temporary and/or permanent basis. This information may include, but is not limited to, data, program code, and/or other information.

Memory 1006 and persistent storage 1008 are examples of storage devices 1016. Memory 1006 may take the form of, for example, a random access memory or some type of volatile or non-volatile storage device. Persistent storage 1008 may comprise any number of components or devices. For example, persistent storage 1008 may comprise a hard drive, a flash memory, a rewritable optical disk, a rewritable magnetic tape, or some combination of the above. The media used by persistent storage 1008 may or may not be removable.

Communications unit 1010 allows data processing system 1000 to communicate with other data processing systems and/or devices. Communications unit 1010 may provide communications using physical and/or wireless communications links.

Input/output unit 1012 allows input to be received from and output to be sent to other devices connected to data processing system 1000. For example, input/output unit 1012 may allow user input to be received through a keyboard, a mouse, and/or some other type of input device. As another example, input/output unit 1012 may allow output to be sent to a printer connected to data processing system 1000.

Display 1014 is configured to display information to a user. Display 1014 may comprise, for example, without limitation, a monitor, a touch screen, a laser display, a holographic display, a virtual display device, and/or some other type of display device.

In this illustrative example, the processes of the different illustrative embodiments may be performed by processor unit 1004 using computer-implemented instructions. These instructions may be referred to as program code, computer usable program code, or computer readable program code and may be read and executed by one or more processors in processor unit 1004.

In these examples, program code 1018 is located in a functional form on computer readable media 1020, which is selectively removable, and may be loaded onto or transferred to data processing system 1000 for execution by processor unit 1004. Program code 1018 and computer readable media 1020 together form computer program product 1022. In this illustrative example, computer readable media 1020 may be computer readable storage media 1024 or computer readable signal media 1026.

Computer readable storage media 1024 is a physical or tangible storage device used to store program code 1018 rather than a medium that propagates or transmits program code 1018. Computer readable storage media 1024 may be, for example, without limitation, an optical or magnetic disk or a persistent storage device that is connected to data processing system 1000.

Alternatively, program code 1018 may be transferred to data processing system 1000 using computer readable signal media 1026. Computer readable signal media 1026 may be, for example, a propagated data signal containing program code 1018. This data signal may be an electromagnetic signal, an optical signal, and/or some other type of signal that can be transmitted over physical and/or wireless communications links.

The illustration of data processing system 1000 in FIG. 10 is not meant to provide architectural limitations to the manner in which the illustrative embodiments may be implemented. The different illustrative embodiments may be implemented in a data processing system that includes components in addition to or in place of those illustrated for data processing system 1000. Further, components shown in FIG. 10 may be varied from the illustrative examples shown.

Figure 11:
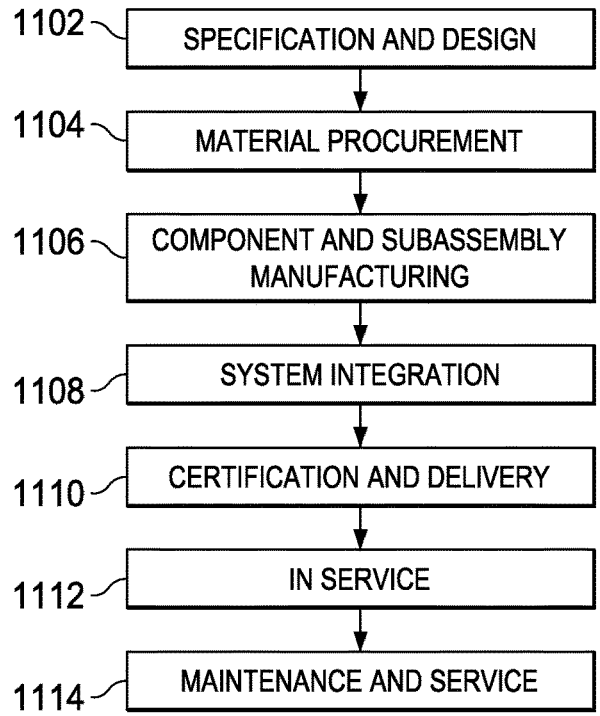
FIG. 11 is an illustration of an aircraft manufacturing and service method in the form of a block diagram in accordance with an illustrative embodiment.
Figure 12:
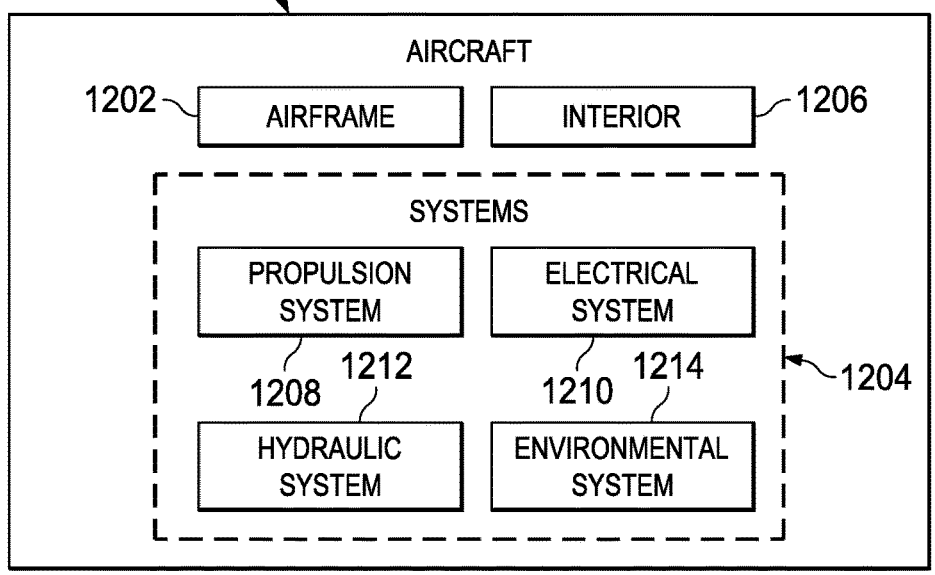
FIG. 12 is an illustration of an aircraft in the form of a block diagram in which an illustrative embodiment may be implemented.

The illustrative embodiments of the disclosure may be described in the context of aircraft manufacturing and service method 1100 as shown in FIG. 11 and aircraft 1200 as shown in FIG. 12. Turning first to FIG. 11, an illustration of an aircraft manufacturing and service method is depicted in the form of a block diagram in accordance with an illustrative embodiment. During pre-production, aircraft manufacturing and service method 1100 may include specification and design 1102 of aircraft 1200 in FIG. 12 and material procurement 1104.

During production, component and subassembly manufacturing 1106 and system integration 1108 of aircraft 1200 in FIG. 12 takes place. Thereafter, aircraft 1200 in FIG. 12 may go through certification and delivery 1110 in order to be placed in service 1112. While in service 1112 by a customer, aircraft 1200 in FIG. 12 is scheduled for routine maintenance and service 1114, which may include modification, reconfiguration, refurbishment, and other maintenance or service.

Each of the processes of aircraft manufacturing and service method 1100 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 12, an illustration of an aircraft is depicted in the form of a block diagram in which an illustrative embodiment may be implemented. In this example, aircraft 1200 is produced by aircraft manufacturing and service method 1100 in FIG. 11 and may include airframe 1202 with plurality of systems 1204 and interior 1206. Examples of systems 1204 include one or more of propulsion system 1208, electrical system 1210, hydraulic system 1212, and environmental system 1214. Any number of other systems may be included. Although an aerospace example is shown, different illustrative embodiments may be applied to other industries, such as the automotive industry. Apparatuses and methods embodied herein may be employed during at least one of the stages of aircraft manufacturing and service method 1100 in FIG. 11.

In one illustrative example, components or subassemblies produced in component and subassembly manufacturing 1106 in FIG. 11 may be fabricated or manufactured in a manner similar to components or subassemblies produced while aircraft 1200 is in service 1112 in FIG. 11. As yet another example, one or more apparatus embodiments, method embodiments, or a combination thereof may be utilized during production stages, such as component and subassembly manufacturing 1106 and system integration 1108 in FIG. 11. One or more apparatus embodiments, method embodiments, or a combination thereof may be utilized while aircraft 1200 is in service 1112 and/or during maintenance and service 1114 in FIG. 11. The use of a number of the different illustrative embodiments may substantially expedite the assembly of and/or reduce the cost of aircraft 1200. For example, analyzer 116 may be used to reduce the time and effort needed to generate a design for aircraft 1220. Further, analyzer 116 may be used to reduce the time and effort needed to change or modify aircraft 1220 when aircraft 1220 is already manufactured, in use, or being certified. Analyzer 116 may be used to reduce the time needed to modify designs for components, physical or logical, during certification or maintenance of aircraft 1220.

Figure 13:
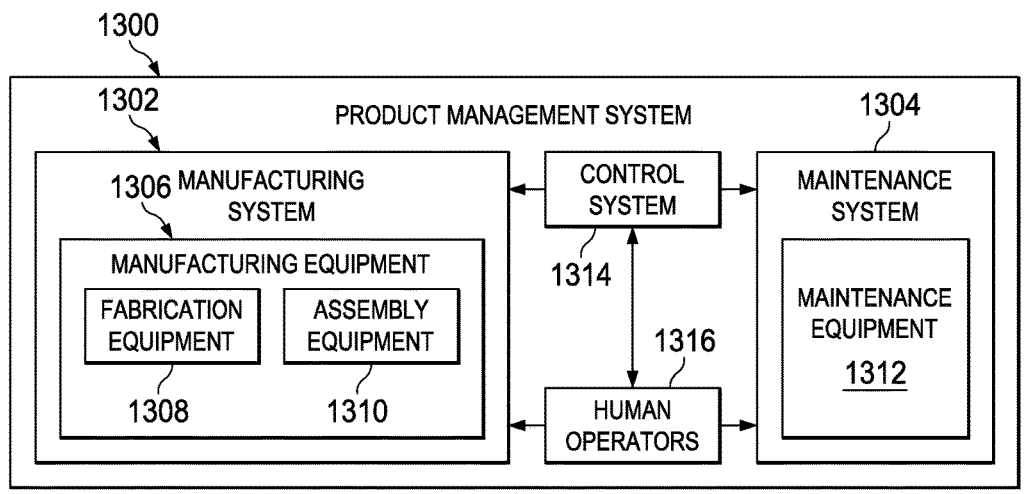
FIG. 13 is an illustration of a block diagram of a product management system in accordance with an illustrative embodiment.

Turning now to FIG. 13, an illustration of a block diagram of a product management system is depicted in accordance with an illustrative embodiment. Product management system 1300 is a physical hardware system. In this illustrative example, product management system 1300 may include at least one of manufacturing system 1302 or maintenance system 1304.

Manufacturing system 1302 is configured to manufacture products, such as aircraft 1200 in FIG. 12. As depicted, manufacturing system 1302 includes manufacturing equipment 1306. Manufacturing equipment 1306 includes at least one of fabrication equipment 1308 or assembly equipment 1310.

Fabrication equipment 1308 is equipment that may be used to fabricate components for parts used to form aircraft 1200. For example, fabrication equipment 1308 may include machines and tools. These machines and tools may be at least one of a drill, a hydraulic press, a furnace, a mold, a composite tape laying machine, a vacuum system, a lathe, or other suitable types of equipment. Fabrication equipment 1308 may be used to fabricate at least one of metal parts, composite parts, semiconductors, circuits, fasteners, ribs, skin panels, spars, antennas, or other suitable types of parts.

Assembly equipment 1310 is equipment used to assemble parts to form aircraft 1200. In particular, assembly equipment 1310 may be used to assemble components and parts to form aircraft 1200. Assembly equipment 1310 also may include machines and tools. These machines and tools may be at least one of a robotic arm, a crawler, a faster installation system, a rail-based drilling system, a robot, or other suitable types of equipment. Assembly equipment 1310 may be used to assemble parts such as seats, horizontal stabilizers, wings, engines, engine housings, landing gear systems, and other parts for aircraft 1200.

In this illustrative example, maintenance system 1304 includes maintenance equipment 1312. Maintenance equipment 1312 may include any equipment needed to perform maintenance on aircraft 1200. This maintenance may include tools for performing different operations on parts on aircraft 1200. These operations may include at least one of disassembling parts, refurbishing parts, inspecting parts, reworking parts, manufacturing placement parts, or other operations for performing maintenance on aircraft 1200. These operations may be for routine maintenance, inspections, upgrades, refurbishment, or other types of maintenance operations.

In the illustrative example, maintenance equipment 1312 may include ultrasonic inspection devices, x-ray imaging systems, vision systems, drills, crawlers, and other suitable device. In some cases, maintenance equipment 1312 may include fabrication equipment 1308, assembly equipment 1310, or both to produce and assemble parts that may be needed for maintenance.

Product management system 1300 also includes control system 1314. Control system 1314 is a hardware system and may also include software or other types of components. Control system 1314 is configured to control the operation of at least one of manufacturing system 1302 or maintenance system 1304. In particular, control system 1314 may control the operation of at least one of fabrication equipment 1308, assembly equipment 1310, or maintenance equipment 1312.

The hardware in control system 1314 may be using hardware that may include computers, circuits, networks, and other types of equipment. The control may take the form of direct control of manufacturing equipment 1306. For example, robots, computer-controlled machines, and other equipment may be controlled by control system 1314. In other illustrative examples, control system 1314 may manage operations performed by human operators 1316 in manufacturing or performing maintenance on aircraft 1200. For example, control system 1314 may assign tasks, provide instructions, display models, or perform other operations to manage operations performed by human operators 1316. In these illustrative examples, at least one of analyzer 116 or modeler 146 may be implemented in control system 1314 to manage at least one of the manufacturing or maintenance of aircraft 1200 in FIG. 12. Analyzer 116, modeler 146 or both may be used to generate and evaluate designs for aircraft 1220. Based on the results of the analysis, aircraft 1220 may be manufactured, upgraded, refurbished, or reworked with components manufactured and assembled under the direction of control system 1314.

In the different illustrative examples, human operators 1316 may operate or interact with at least one of manufacturing equipment 1306, maintenance equipment 1312, or control system 1314. This interaction may be performed to manufacture aircraft 1200. This interaction also may be performed to manufacture components for aircraft 1200 that may be installed as part refurbishment, upgrade, maintenance, or other suitable operations for aircraft 1200.

Of course, product management system 1300 may be configured to manage other products other than aircraft 1200. Although product management system 1300 has been described with respect to manufacturing in the aerospace industry, product management system 1300 may be configured to manage products for other industries. For example, product management system 1300 may be configured to manufacture products for the automotive industry as well as any other suitable industries.

In this manner, an analysis of zones in a vehicle may form more quickly than currently possible. With the use of analyzer 116 hundreds of thousands or millions of parts in various zones may be analyzed during the design process. With the use of a three-dimensional physical model and a logical model that has its components mapped to the physical model, an identification of the effects of undesired operation of physical components in a zone on other physical components within a vehicle may be more easily made. The needed for this type of analysis may be made more easily, especially with an ability to identify the flow items to transport elements.

Further, with one or more illustrative embodiments, an analysis may be performed to search for potential zones that may result in an undesired operation of one or more systems in a vehicle or the vehicle as a whole as described by a three-dimensional physical model. In this manner, an identification of the effects of a failure or other undesired operation in physical components in a zone may be identified more easily as compared to currently available techniques. Further, the manner in which a logical architecture is implemented for a vehicle also may be analyzed to determine whether an undesired operation of components in a zone may cause other systems for the aircraft to operate in a manner that fails to meet a policy such as a safety standard.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An apparatus comprising:
   a data processing system configured such that in operation a processor of the data processing system implements:

a three-dimensional physical model of a vehicle, wherein the three-dimensional physical model includes geometry information identifying shapes of physical components in the vehicle, location information identifying where the physical components are located in the vehicle, and physical connections between the physical components in the vehicle, wherein the physical components include communications systems that transport information, and electrical systems that generate or carry electricity;

a logical model of the vehicle including a logical architecture comprising logical connections linking logical components to each other, wherein the logical model identifies a plurality of functions performed by the logical components, wherein the logical connections identify a flow of elements between the logical components in the logical model, and wherein the flow of elements between the logical components cannot be identified from the three-dimensional physical model of the vehicle;

wherein physical components in the three-dimensional physical model are linked to logical components in the logical model by links in a map, each link in the map comprising a particular identifier assigned to one or more physical components and to one or more logical components that correspond to the one or more physical components; and an analyzer that identifies an effect of an undesired operation of a group of physical components in a zone within the three-dimensional physical model of the vehicle based on the three-dimensional physical model and the logical model by:

identifying the zone in the three-dimensional physical model of the vehicle, wherein the zone is a volume in the three-dimensional physical model, identifying the physical components in the zone using the three-dimensional physical model, identifying the logical components in the logical model corresponding to the physical components in the zone using the links in the map, and identifying the effect of the undesired operation of the physical components in the zone using the logical connections to the logical components in the logical model corresponding to the physical components in the zone.

2. The apparatus of claim 1, wherein the analyzer identifies the effect of the undesired operation of the group of physical components in the zone within the three-dimensional physical model of the vehicle on at least one of a group of systems in the vehicle or the vehicle as a whole; and
   wherein the analyzer compares physical components with the logical model to ensure a remaining level of component redundancy.

3. The apparatus of claim 1, wherein the analyzer determines whether the effect of the undesired operation meets a policy for the vehicle.

4. The apparatus of claim 3, wherein the policy is selected from one of a standard, a safety standard, a government safety regulation, a performance standard, and a requirements document.

5. The apparatus of claim 3, wherein the analyzer determines whether the zone has a potentially undesirable aircraft level effect based on the policy and the effect of the undesired operation of the group of physical components in the zone.

6. The apparatus of claim 1, wherein the analyzer determines whether the effect causes any of the plurality of functions performed by the logical components in the vehicle to operate in an undesired manner.

7. The apparatus of claim 1, wherein the analyzer identifies the effect of the undesired operation of the group of physical components in the zone within the three-dimensional physical model of the vehicle based on a change made to a portion to at least one of the three-dimensional physical model or the logical model prior to acceptance of the change for the vehicle.

8. The apparatus of claim 1, wherein the data processing system is configured such that in operation the processor of the data processing system implements:
a modeler that generates the three-dimensional physical model of the vehicle with a group of zones for analysis.

9. The apparatus of claim 8, wherein the modeler generates the map of a correspondence between the physical components and the logical components.

10. The apparatus of claim 1, wherein the physical components further comprises at least one of a hydraulics system, a ventilation system, or a fire suppression system.

11. The apparatus of claim 1, wherein the physical components in the zone includes an air data sensor, and wherein the analyzer identifies an effect on a flight control computer caused by undesired operation of the air data sensor.

12. A model based safety analysis system for an aircraft comprising:
a data processing system configured such that in operation a processor of the data processing system implements:
a three-dimensional physical model of the aircraft, wherein the three-dimensional physical model includes geometry information identifying shapes of physical components in the aircraft, location information identifying where the physical components are located in the aircraft, and physical connections between the physical components in the aircraft, the physical components including communications systems that transport information and electrical systems that generate or carry electricity;
a logical model of the aircraft including a logical architecture comprising logical connections linking logical components to each other, wherein the logical model identifies a plurality of functions performed by the logical components, wherein the logical connections identify a flow of elements between the logical components in the logical model of the aircraft, and wherein the flow of elements between the logical components cannot be identified from the three-dimensional physical model of the aircraft;
a map identifying a correspondence between physical components in the three-dimensional physical model and logical components in the logical model, wherein physical components in the three-dimensional physical model are linked to logical components in the logical model by links in the map, each link in the map comprising a particular identifier assigned to one or more physical components and to one or more logical components that correspond to the one or more physical components; and
an analyzer configured to identify effects of undesired operations of the physical components in different zones within the three-dimensional physical model of the aircraft on at least one of a group of systems in the aircraft or the aircraft as a whole based on the three-dimensional physical model, the logical model, and the map, to identify a group of zones within the aircraft that have potentially undesirable aircraft level effects based on the effects identified for the undesired operations of the physical components, by:
identifying a zone in the three-dimensional physical model of the aircraft, wherein the zone is a volume in the three-dimensional physical model,
identifying the physical components in the zone using the three-dimensional physical model,
identifying the logical components in the logical model corresponding to the physical components in the zone using the links in the map, and
identifying the effect of the undesired operation of the physical components in the zone using the logical connections to the logical components in the logical model corresponding to the physical components in the zone.

13. A method for zone analysis, the method comprising:
identifying a zone in a three-dimensional physical model of a vehicle, wherein the zone is a volume in the three-dimensional physical model, the three-dimensional physical model including geometry information identifying shapes of physical components in the vehicle, location information identifying where the physical components are located in the vehicle, and physical connections between the physical components in the vehicle; and
identifying an effect of an undesired operation of a group of components in the zone within the three-dimensional physical model of the vehicle based on the three-dimensional physical model of the vehicle and a logical model of the vehicle including a logical architecture comprising logical connections linking logical components to each other, wherein the logical model identifies a plurality of functions performed by the logical components, wherein the logical connections identify a flow of elements between the logical components in the logical model, wherein the flow of elements between the logical components cannot be identified from the three-dimensional physical model of the vehicle, and wherein the physical components in the three-dimensional physical model are linked to logical components in the logical model by links in a map, each link in the map comprising a particular identifier assigned to one or more physical components and to one or more logical components that correspond to the one or more physical components, by:
identifying the physical components in the zone using the three-dimensional physical model,
identifying the logical components in the logical model corresponding to the physical components in the zone using the links in the map, and
identifying the effect of the undesired operation of the physical components in the zone using the logical connections to the logical components in the logical model corresponding to the physical components in the zone.

14. The method of claim 13, wherein the physical components include communications systems that transport information and electrical systems that generate or carry electricity.

15. The method of claim 13 further comprising:
identifying the effect of the undesired operation of the group of components in the zone within the three-dimensional physical model of the vehicle on at least one of a group of systems in the vehicle and the vehicle as a whole.

16. The method of claim 13 further comprising:
determining whether the effect of the undesired operation meets a policy for the vehicle, wherein the policy is selected from one of a standard, a safety standard, a government safety regulation, a performance standard, and a requirements document.

17. The method of claim 16, wherein an analyzer is configured to determine whether the zone has a potentially undesirable aircraft level effect based on the policy.

18. The method of claim 13 further comprising:
determining whether the effect causes any of the plurality of functions performed by the logical components in the vehicle to operate in an undesired manner.

19. The method of claim 13 further comprising:
identifying the effect of the undesired operation of the group of components in the zone within the three-dimensional physical model of the vehicle based on a change made to a portion of at least one of the three-dimensional physical model or the logical model prior to acceptance of the change for the vehicle.

20. The method claim 13 further comprising;
generating the three-dimensional physical model of the vehicle with a group of zones for analysis;
generating the logical model of the vehicle; and
generating the map of correspondence between the physical components in the three-dimensional physical model and the logical components in the logical model.

* * * * *